United States Patent
Lee et al.

(10) Patent No.: US 12,033,682 B2
(45) Date of Patent: Jul. 9, 2024

(54) IN-PLANE MAGNETIZED SPIN-ORBIT MAGNETIC DEVICE

(71) Applicant: Industrial Technology Research Institute, Hsinchu (TW)

(72) Inventors: Hsin-Han Lee, Hsinchu (TW); Jeng-Hua Wei, Taipei (TW); I-Jung Wang, Hsinchu (TW); Shan-Yi Yang, Hsinchu (TW); Yao-Jen Chang, Yunlin County (TW); Fang-Ming Chen, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 289 days.

(21) Appl. No.: 17/563,100

(22) Filed: Dec. 28, 2021

(65) Prior Publication Data

US 2023/0178130 A1 Jun. 8, 2023

(30) Foreign Application Priority Data

Dec. 2, 2021 (TW) ................. 110144999

(51) Int. Cl.
*G11C 11/16* (2006.01)
*H10B 61/00* (2023.01)
(Continued)

(52) U.S. Cl.
CPC ........ *G11C 11/161* (2013.01); *G11C 11/1675* (2013.01); *H10B 61/00* (2023.02);
(Continued)

(58) Field of Classification Search
CPC ... G11C 11/161; G11C 11/1675; G11C 11/18; H10B 61/00; H10N 50/80; H10N 50/85; H10N 50/01; H10N 50/10; H10N 52/80
See application file for complete search history.

(56) References Cited

U.S. PATENT DOCUMENTS

| 7,355,824 B2 | 4/2008 | Nishiyama et al. |
| 9,608,039 B1 * | 3/2017 | Apalkov ............... G11C 11/161 |

(Continued)

FOREIGN PATENT DOCUMENTS

| CN | 1934652 | 3/2007 |
| CN | 101019190 | 8/2007 |

(Continued)

OTHER PUBLICATIONS

Sasikanth Manipatruni et al., "Energy-delay performance of giant spin Hall effect switching for dense magnetic memory", Applied Physics Express, vol. 7, Sep. 2014, pp. 103001-1-103001-4.
(Continued)

*Primary Examiner* — Allison Bernstein
(74) *Attorney, Agent, or Firm* — JCIPRNET

(57) ABSTRACT

An in-plane magnetized spin-orbit magnetic device is provided. The in-plane magnetized spin-orbit magnetic device includes a heavy metal layer, an antiferromagnetic layer, and a magnetic tunnel junction. The antiferromagnetic layer is disposed on the heavy metal layer, and the magnetic tunnel junction is disposed on the antiferromagnetic layer. The magnetic tunnel junction includes a free layer, a barrier layer, and a pinned layer. The barrier layer is disposed on the free layer, and the pinned layer is disposed on the barrier layer. A film surface shape of the free layer is a rounded rectangle.

20 Claims, 14 Drawing Sheets

(51) Int. Cl.
*H10N 50/80* (2023.01)
*H10N 50/85* (2023.01)
*H10N 52/80* (2023.01)

(52) U.S. Cl.
CPC ............. *H10N 50/80* (2023.02); *H10N 50/85* (2023.02); *H10N 52/80* (2023.02)

(56) References Cited

U.S. PATENT DOCUMENTS

| | | | |
|---|---|---|---|
| 9,754,653 | B2 | 9/2017 | Prejbeanu |
| 9,953,692 | B1 | 4/2018 | Mihajlovic et al. |
| 10,546,622 | B2 | 1/2020 | Chen et al. |
| 10,784,441 | B2 | 9/2020 | Lee et al. |
| 10,944,045 | B2 | 3/2021 | Sasaki et al. |
| 2007/0253120 | A1 | 11/2007 | Saito et al. |
| 2017/0179372 | A1 | 6/2017 | Braganca |
| 2019/0304653 | A1* | 10/2019 | Oguz ............... H10N 50/01 |
| 2022/0109100 | A1* | 4/2022 | Lee ................. H10N 50/85 |

FOREIGN PATENT DOCUMENTS

| | | |
|---|---|---|
| CN | 102074329 | 4/2012 |
| CN | 106654002 | 12/2018 |
| CN | 110660899 | 1/2020 |
| CN | 113707804 | 11/2021 |
| JP | 2007180470 | 7/2007 |
| JP | 2007299931 | 11/2007 |
| TW | I634680 | 9/2018 |
| TW | I688130 | 3/2020 |
| TW | I704558 | 9/2020 |

OTHER PUBLICATIONS

Ioan Mihai Miron et al., "Perpendicular switching of a single ferromagnetic layer induced by in-plane current injection", Nature, vol. 476, Aug. 2011, pp. 189-193.
Sk. Ziaur Rahaman et al., "Pulse-Width and Temperature Effect on the Switching Behavior of an Etch-Stopon-MgO-Barrier Spin-Orbit Torque MRAM Cell", IEEE Electron Device Letters, vol. 39, Issue 6, Sep. 2018, pp. 1306-1309.
Po-Hung Lin et al., "Manipulating exchange bias by spin-orbit torque", Nature Materials, vol. 18, Apr. 2019, pp. 335-342.
Antoine Chavent et al., "Effects of the Heating Current Polarity on the Writing of Thermally Assisted Switching-MRAM", IEEE Transactions on Magnetics, vol. 50, Issue 11, Nov. 2014, pp. 1-4.
"Notice of allowance of Taiwan Counterpart Application", dated Sep. 20, 2022, p. 1-p. 3.

* cited by examiner

IN-PLANE MAGNETIZED SPIN-ORBIT MAGNETIC DEVICE

CROSS-REFERENCE TO RELATED APPLICATION

This application claims the priority benefit of Taiwan application serial no. 110144999, filed on Dec. 2, 2021. The entirety of the above-mentioned patent application is hereby incorporated by reference herein and made a part of this specification.

BACKGROUND

Technical Field

The disclosure relates to an in-plane magnetized spin-orbit magnetic device.

Description of Related Art

The magnetic random access memory (MRAM) has the advantages of fast speed, low energy consumption, high density, non-volatility, and almost unlimited times of reading and writing, and is predicted to be the mainstream of the next generation memory. The main structure of a memory device in the magnetic random access memory is a stacked structure formed by stacking a pinned layer with a ferromagnetic/non-magnetic metal/ferromagnetic three-layer material, a tunneling barrier layer, and a free layer with a magnetic material. Such stacked structure may be referred to as a magnetic tunnel junction (MTJ) device. Since a write current only passes through the selected magnetic tunnel junction device, and magnetic reversal depends on the intensity of the write current and the intensity of an external magnetic field, it is conducive to the decrease of the write current after the magnetic tunnel junction device is miniaturized. In theory, the write selectivity could be improved while reducing the write current.

The magnetic tunnel junction device that reads and writes with the spin-orbit-torque (SOT) mechanism may be divided into an in-plane MTJ device and a perpendicular MTJ device. If the spin-orbit torque mechanism is used to implement the structure of the magnetic random access memory, the operating speed and the writing reliability could be further improved. The reversal mechanism of the spin-orbit-torque in the in-plane MTJ device is to pass the write current into a heavy metal layer formed by a ferromagnetic material. The heavy metal layer generates a spin transfer torque (STT) due to the spin Hall effect and the external magnetic field. In addition, the write current generates a Rashba torque (RT) after passing through a vertical electric field at a material interface and the external magnetic field. Since the two torques, STT and RT, are both perpendicular to the direction of the write current and parallel to a film surface, the two torques will add up to become the SOT. Therefore, if a magnetic field is applied to the ferromagnetic material on the film surface perpendicular to a magnetic moment, the SOT may be generated to reverse the magnetic moment of the ferromagnetic layer, so as to achieve the objective of writing to the memory device.

SUMMARY

An embodiment of the disclosure provides an in-plane magnetized spin-orbit magnetic device. The in-plane magnetized spin-orbit magnetic device includes a heavy metal layer, an antiferromagnetic layer, and a magnetic tunnel junction. The antiferromagnetic layer is disposed on the heavy metal layer, and the magnetic tunnel junction is disposed on the antiferromagnetic layer. The magnetic tunnel junction includes a free layer, a barrier layer, and a pinned layer. The barrier layer is disposed on the free layer. The pinned layer is disposed on the barrier layer. A film surface shape of the free layer is a rounded rectangle.

An embodiment of the disclosure provides an in-plane magnetized spin-orbit magnetic device. The in-plane magnetized spin-orbit magnetic device includes a heavy metal layer, an antiferromagnetic layer, a magnetic tunnel junction, a first via, a second via, a first lower electrode, and a second lower electrode. The antiferromagnetic layer is disposed on the heavy metal layer, and the magnetic tunnel junction is disposed on the antiferromagnetic layer. The first via and the second via are disposed under the heavy metal layer. The first lower electrode is coupled to the heavy metal layer by the first via, and the second lower electrode is coupled to the heavy metal layer by the second via. The magnetic tunnel junction includes a free layer, a barrier layer, and a pinned layer. The barrier layer is disposed on the free layer. The pinned layer is disposed on the barrier layer. A film surface shape of the pinned layer is an ellipse. There is a first included angle between a connecting line between the first via and the second via on a film surface plane and a short axis direction of the ellipse in the film surface shape of the pinned layer, and the first included angle is not zero degrees. Alternatively, there is a second included angle between a long side direction of the free layer and a long axis direction of the ellipse in the film surface shape of the pinned layer, and the second included angle is not a right angle.

DETAILED DESCRIPTION OF DISCLOSED EMBODIMENTS

In the embodiment, an antiferromagnetic layer is added between a heavy metal layer and a magnetic tunnel junction, thereby increasing thermal stability of a free layer in a magnetic device when being reversed. A film surface shape of the free layer is designed as a rounded rectangle to affect reversal properties of a magnetic moment through a radius parameter of a rounded corner, so that the magnetic moment of the free layer is more easily affected by a spin-orbit-torque to be adjusted. A placement angle of vias and a pinned layer is adjusted, so that there is a preset included angle between a switching current and a short axis direction of an ellipse of a film surface shape of the pinned layer to reduce a switching current density required for reversing the aforementioned device. The aforementioned manners may all be applied to an in-plane magnetized spin-orbit magnetic device, so that while the free layer has thermal stability, the magnetic moment of the free layer may be more easily affected by the spin-orbit-torque caused by the current of the heavy metal layer to be magnetically reversed, so the magnitude of a write current in the heavy metal layer could be reduced. The details of each embodiment are described below. Persons applying the embodiment may adjust the material and thickness of each layer according to requirements, thereby implementing the function of the layer. The disclosure of the following embodiments is one or more suitable examples.

Figure 1:
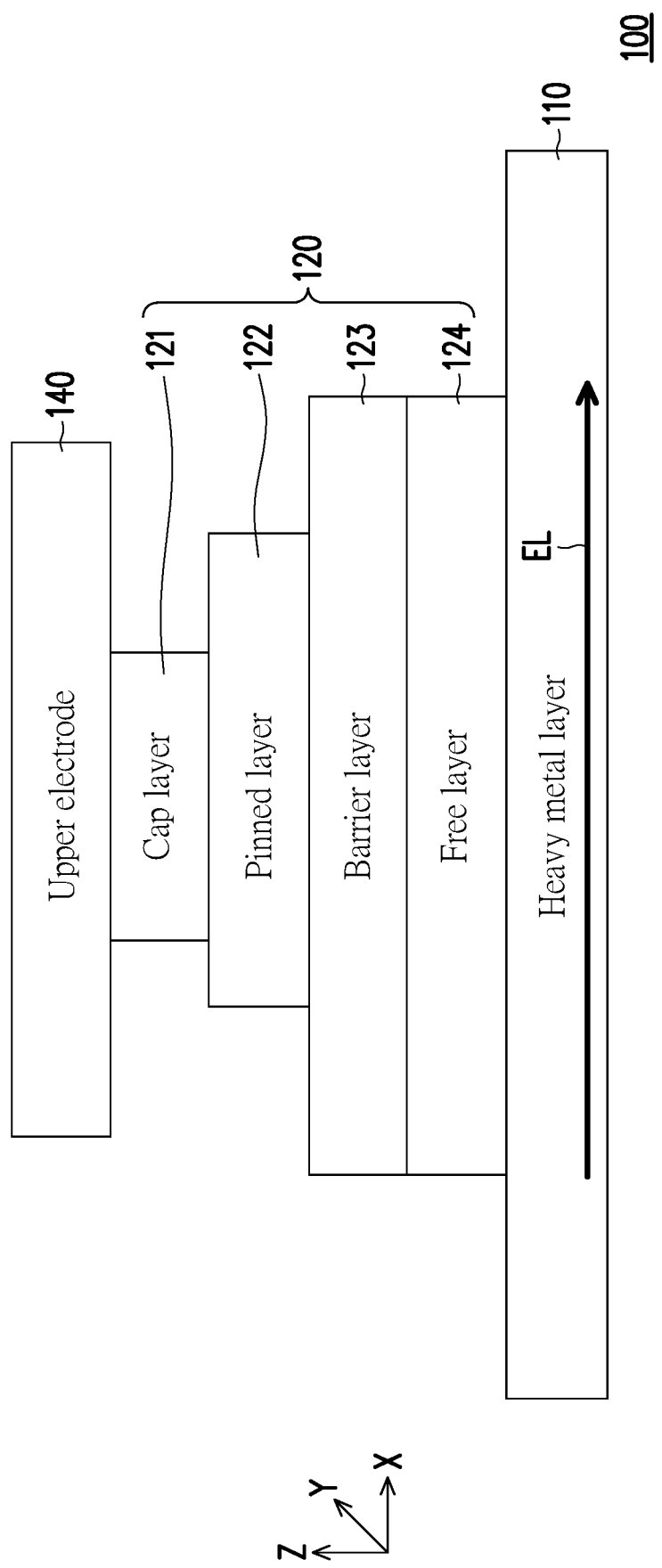
FIG. 1 is a schematic view of a structure of an in-plane magnetized spin-orbit magnetic device.

For the convenience of description, the coordinate axes X, Y, and Z are set in the drawings of multiple embodiments of the disclosure to facilitate the subsequent description. FIG. 1 is a schematic view of a structure of an in-plane magnetized spin-orbit magnetic device according to the embodiment. An in-plane magnetized spin-orbit magnetic device 100 mainly includes a heavy metal layer 110, a magnetic tunnel junction 120, and an upper electrode 140. The magnetic tunnel junction 120 is disposed on the heavy metal layer 110. The magnetic tunnel junction 120 is arranged between the heavy metal layer 110 and the upper electrode 140.

The heavy metal layer 110 may also be referred to as a write line. The heavy metal layer 110 obtains an input current EL through an electrode contact to generate a spin current, so that the magnetic tunnel junction 120 is magnetically reversed. The material of the heavy metal layer 110 in the embodiment may be tantalum (Ta), platinum (Pt), tungsten (W), or an alloy of a combination of the three. The thickness of the heavy metal layer 110 may be 20 angstroms (Å) to 200 Å.

The upper electrode 140 may also be referred to as a bit line, which is used to read data stored in the magnetic tunnel junction 120 in the in-plane magnetized spin-orbit magnetic device 100. The material of the upper electrode 140 is a conductive material, such as copper (Cu), aluminum (Al), tantalum (Ta), or an alloy of a combination of the elements.

The magnetic tunnel junction 120 mainly includes a cap layer 121, a pinned layer 122, a barrier layer 123, and a free layer 124. The free layer 124 is disposed on the heavy metal layer 110. The barrier layer 123 is disposed on the free layer 134. The pinned layer 122 is disposed on the barrier layer 123. The material of the cap layer 121 is a material that may be made by etching and may be tantalum (Ta).

The material of the pinned layer 122 is a ferromagnetic material with an in-plane magnetic moment, and a magnetic moment vector of the pinned layer 122 is arranged parallel to the film surface. The material of the pinned layer 122 includes iron (Fe), cobalt (Co), nickel (Ni), gadolinium (Gd), terbium (Tb), dysprosium (Dy), boron (B), or an alloy of a combination of the seven. In detail, the pinned layer 122 is, for example, a ferromagnetic/non-magnetic metal/ferromagnetic material stacking layer composed of a lower pinned layer, a coupling layer, and an upper pinned layer. The upper pinned layer and the lower pinned layer may have a single layer or a composite multilayer structure. The upper pinned layer or the lower pinned layer with the single layer structure may be implemented through a ferromagnetic material such as iron (Fe), cobalt (Co), and nickel (Ni), or an alloy of the elements. The upper pinned layer or the lower pinned layer with the composite multilayer structure may be a composite-layer structure of a ferromagnetic material and a metal material, for example, a composite-layer structure composed of elements such as cobalt (Co)/platinum (Pt), cobalt (Co)/nickel (Ni), and cobalt (Co)/palladium (Pd).

The free layer 124 is a memory layer in the in-plane magnetized spin-orbit magnetic device 100. The heavy metal layer 110 may receive an input current EL from the electrode contact of the in-plane magnetized spin-orbit magnetic device 100. The input current EL flows through the heavy metal layer 110 to generate various spin currents with different directions due to the spin Hall effect (SHE), thereby generating a resultant torque with an external magnetic field, so that the magnetic moment of the free layer 124 is reversed, so as to achieve the objective of data reading and writing. The material of the free layer 124 is a ferromagnetic material with horizontal heterogeneity. The ferromagnetic material of the free layer 124 may be iron (Fe), cobalt (Co), nickel (Ni), gadolinium (Gd), terbium (Tb), dysprosium (Dy), boron (B), or an alloy of the elements, such as CoFeB, NF, and FeB. The thickness of the free layer 124 may be 10 Å to 100 Å. The free layer 124 may have a single layer structure or a composite multilayer structure. If the free layer is a composite structure formed of a multilayer ferromagnetic material, the material of the composite multilayer structure may be composed of elements such as cobalt (Co)/platinum (Pt), cobalt (Co)/nickel (Ni), and cobalt (Co)/palladium (Pd).

The cap layer 121 is disposed between the upper electrode 140 and the pinned layer 122. The barrier layer 123 is disposed between the free layer 124 and the pinned layer 122. The barrier layer 123 may have a preset thickness obtained through experiments, thereby effectively isolating spin current transfer of metals or ferromagnetic materials of the upper and lower layers, so that the operating mechanism of each layer could be simple and does not affect each other. The barrier layer 123 of the embodiment may be an insulating material that has magnetic tunneling conditions under a specific thickness. The insulating materials may be magnesium oxide, aluminum oxide, or a combination of the two.

Figure 2:
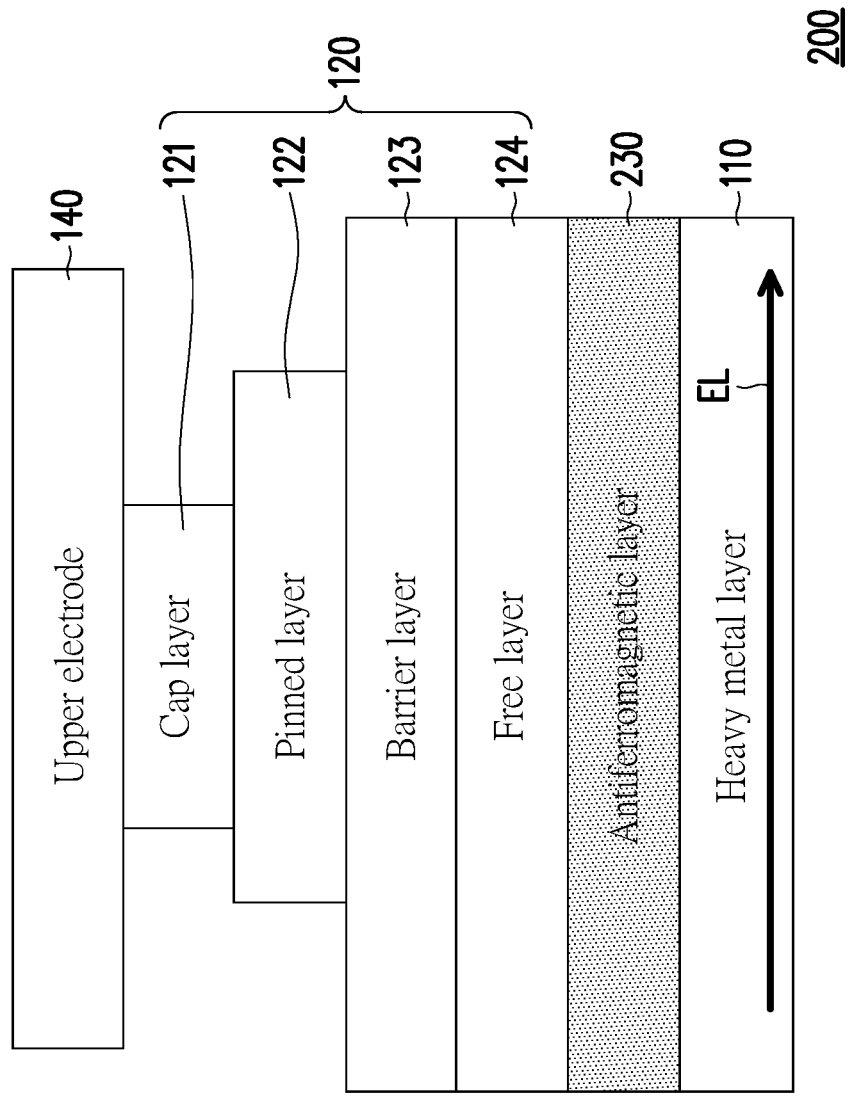
FIG. 2 is a schematic view of a structure of an in-plane magnetized spin-orbit magnetic device according to Embodiment 1 of the disclosure.

FIG. 2 is a schematic view of a structure of an in-plane magnetized spin-orbit magnetic device 200 according to Embodiment 1 of the disclosure. The same devices in FIG. 2 and FIG. 1 have the same reference numerals and the same functions. The difference between FIG. 2 and FIG. 1 is that an antiferromagnetic layer 230 is added between the heavy metal layer 110 and the magnetic tunnel junction 120. In other words, in FIG. 2, the antiferromagnetic layer 230 is disposed on the heavy metal layer 110, and the magnetic tunnel junction 120 is disposed on the antiferromagnetic layer 230. The material of the antiferromagnetic layer 230 may be iridium manganese (IrMn), iron manganese (FeMn), platinum manganese (PtMn), nickel manganese (NiMn), or other metals or alloys with antiferromagnetic properties. The thickness of the antiferromagnetic layer may be 1 Å to 50 Å.

Figure 3:
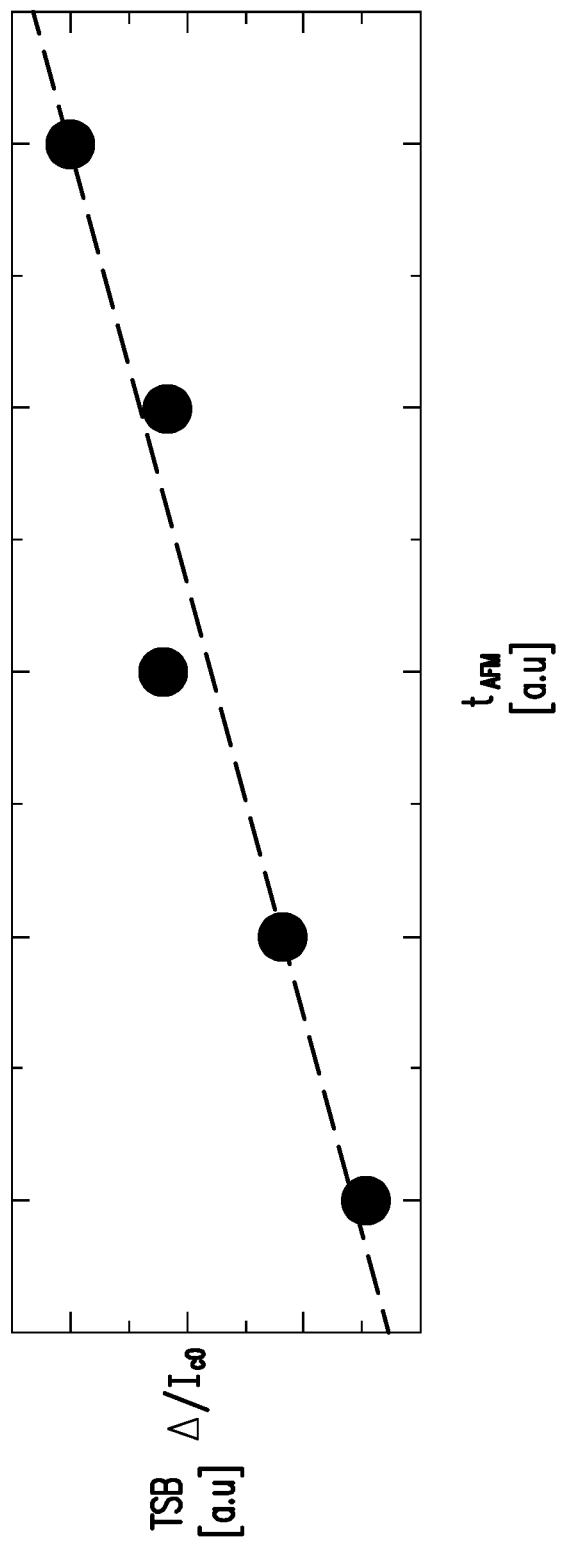
FIG. 3 is a schematic view of a relationship between an antiferromagnetic layer thickness and a thermal stability according to Embodiment 1 of the disclosure.

As a result, measurement shows that since the antiferromagnetic layer 230 is disposed under the free layer 124 in the magnetic tunnel junction 120, the thermal stability of the free layer 124 when being reversed is significantly improved. FIG. 3 is a schematic view of a relationship between an antiferromagnetic layer thickness $t_{AFM}$ and a thermal stability TSB according to Embodiment 1 of the disclosure. The thermal stability TSB (also referred to as a switching efficiency) is computed based on "Δ(thermal stability factor)/EL (input current)", which is a thermal stability coefficient per unit of switching current. In detail, the calculation equation of the thermal stability coefficient Δ is $\Delta = K_{eff} \times V/K_B T$. A parameter $K_{eff}$ is used to express the anisotropic energy density and is in the unit of energy. A parameter V is in the unit of volume. A parameter KB is the Boltzmann's constant. A parameter T is the temperature. Therefore, since the numerator ($K_{eff} \times V$) and denominator ($K_B T$) for presenting the thermal stability coefficient Δ in the aforementioned equation are both in the unit of energy, the thermal stability coefficient Δ has no unit.

It could be seen from FIG. 3 that when the antiferromagnetic layer thickness $t_{AFM}$ is thicker, the value of the thermal stability TSB is higher, so that the thermal stability of the free layer 124 when being reversed could be significantly improved. On the other hand, the film surface shape of the heavy metal layer 110 in FIG. 2 may be different from the film surface shape of the free layer 124. Other embodiments will be described in detail below.

Figure 4:
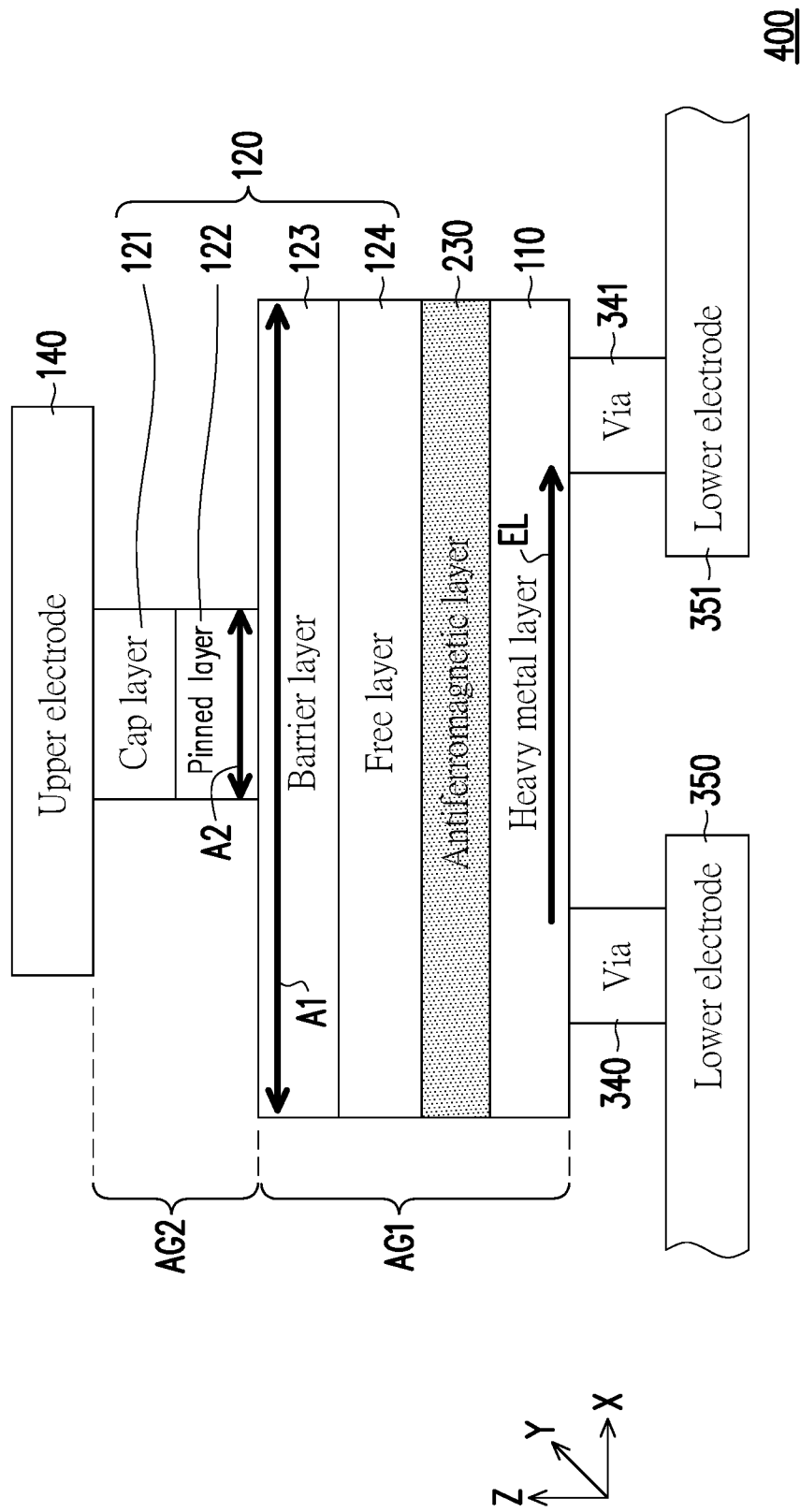
FIG. 4 is a schematic view of a structure of an in-plane magnetized spin-orbit magnetic device according to Embodiment 2 of the disclosure.

FIG. 4 is a schematic view of a structure of an in-plane magnetized spin-orbit magnetic device 400 according to Embodiment 2 of the disclosure. The same devices in FIG. 4 and the aforementioned embodiments have the same reference numerals and the same functions. The difference between FIG. 4 and FIG. 2 is that the film surface shape of the free layer 124 in FIG. 4 is designed as a rounded rectangle to affect the reversal properties of the magnetic moment through the radius parameter of the rounded corner, so that the magnetic moment of the free layer 124 may be more easily affected by the spin-orbit-torque to be adjusted. In detail, in Embodiment 2 of FIG. 4, the barrier layer 123 of the magnetic tunnel junction 120 has the same film surface area A1 as the free layer 124, the antiferromagnetic layer 230, and the heavy metal layer 110, and the barrier layer 123, the free layer 124, the antiferromagnetic layer 230, and the heavy metal layer 110 have the same film surface shape AG1 (presented as rounded rectangles in FIG. 5, FIG. 7, and FIG. 8). The cap layer 121 and the pinned layer 122 of the magnetic tunnel junction 120 have the same film surface area A2, and the cap layer 121 and the pinned layer 122 have the same film surface shape AG2 (presented as ellipses in FIG. 5). The film surface area A2 of the ellipse is smaller than the film surface area A1 of the rounded rectangle.

Figure 5:
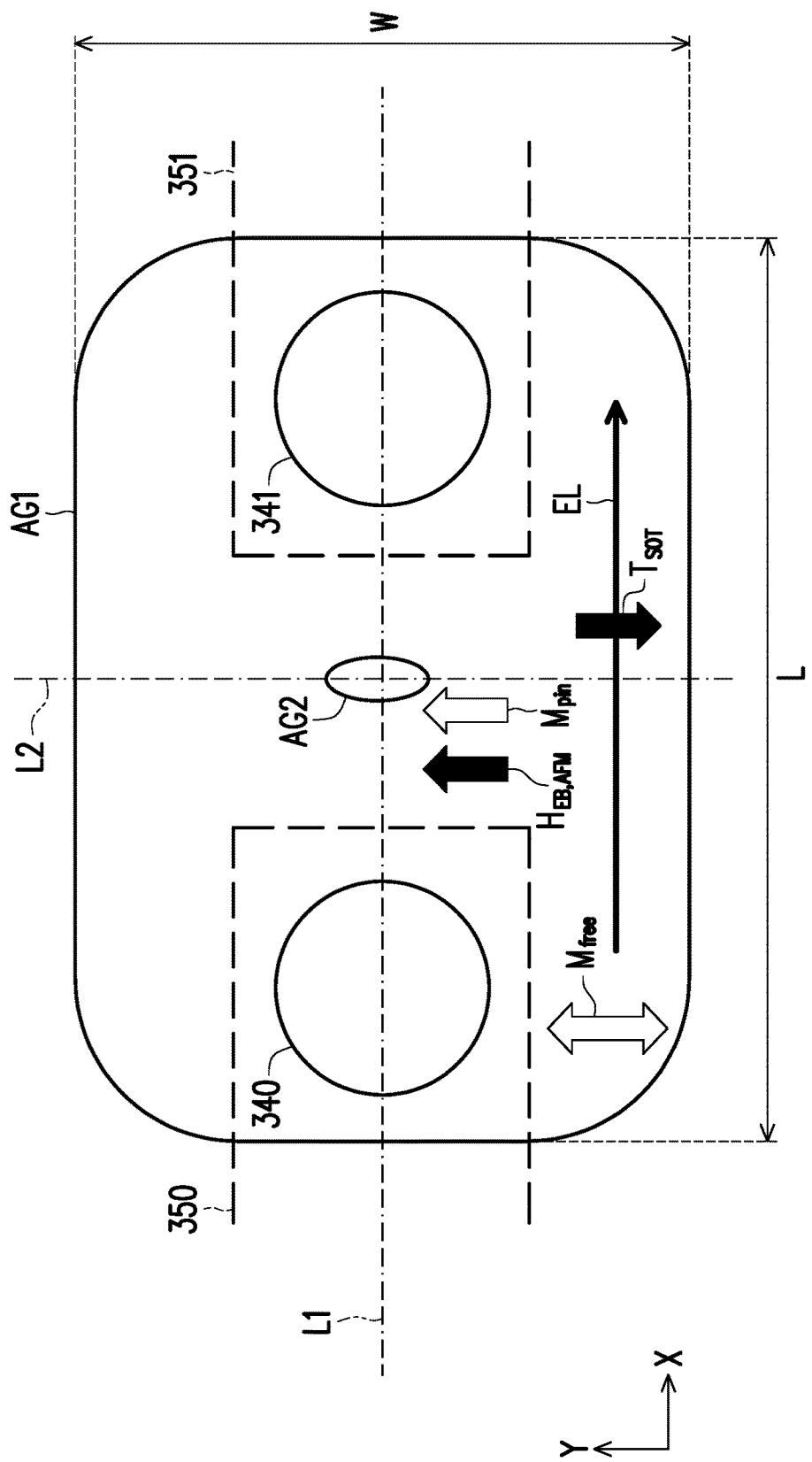
FIG. 5 is a top view of a structure of an in-plane magnetized spin-orbit magnetic device according to Embodiment 2-1 of the disclosure.
Figure 7:
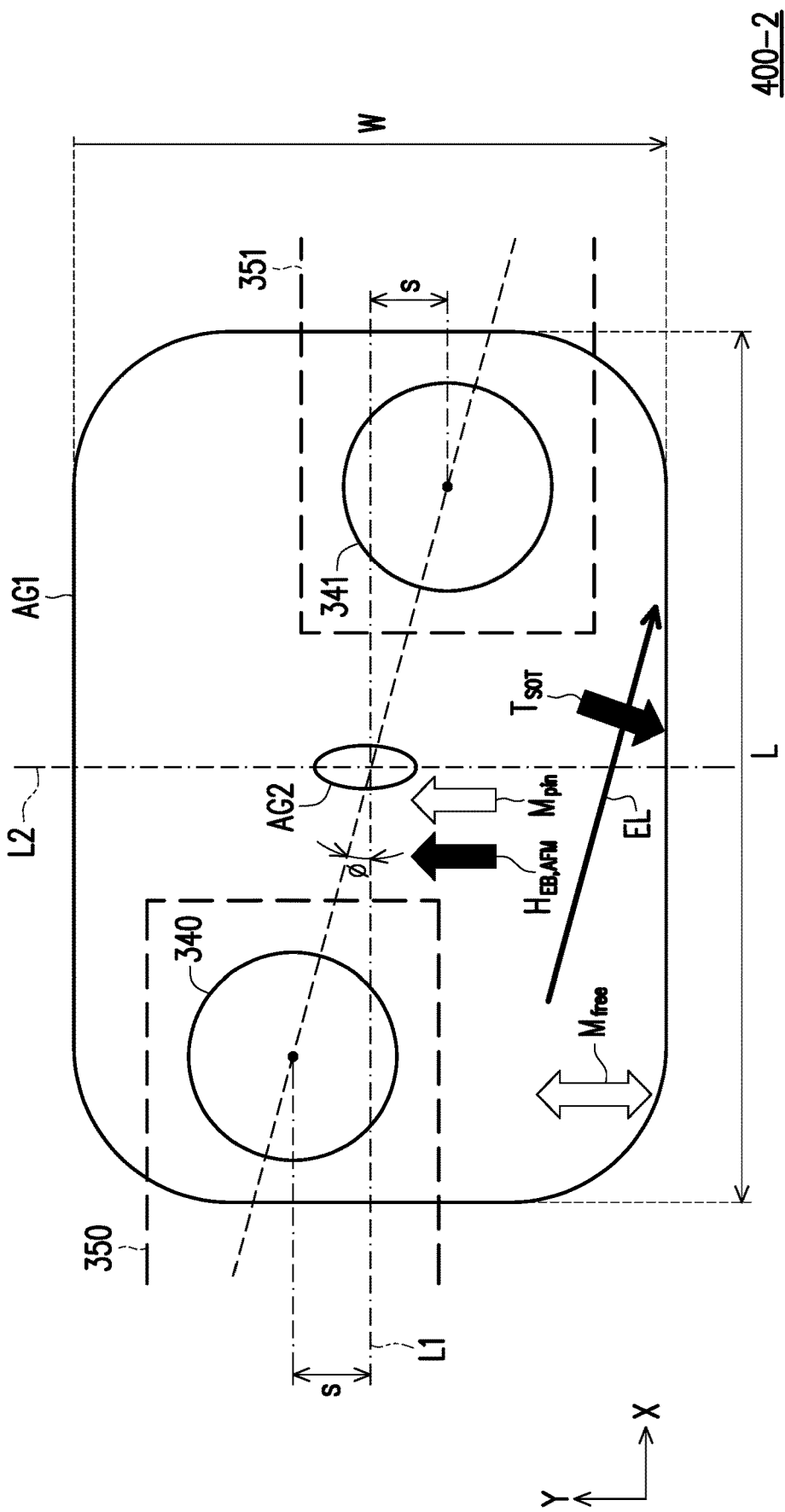
FIG. 7 is a top view of a structure of an in-plane magnetized spin-orbit magnetic device according to Embodiment 2-2 of the disclosure.
Figure 8:
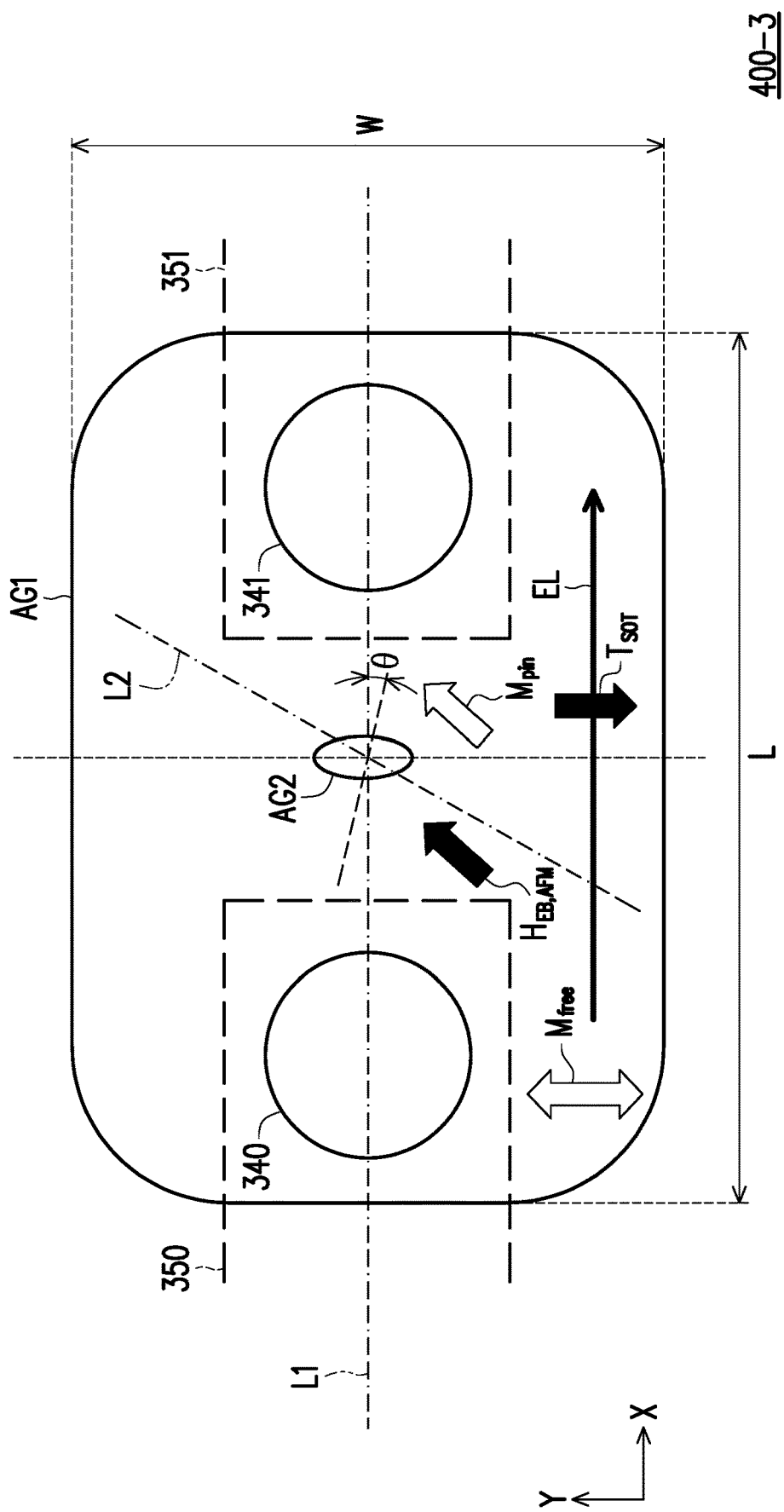
FIG. 8 is a top view of a structure of an in-plane magnetized spin-orbit magnetic device according to Embodiment 2-3 of the disclosure.

Since the adjustment of the placement relationship between two vias 340 and 341 and the pinned layer 122 and the free layer 124 on an XY plane also presents different technical solutions, which could not be presented through the cross-sectional view of the structure of FIG. 4, the same will be presented through the top views of the structures of FIG. 5, FIG. 7, and FIG. 8.

FIG. 5 is a top view of a structure of an in-plane magnetized spin-orbit magnetic device 400-1 according to Embodiment 2-1 of the disclosure. Thee film surface shape AG1 corresponding to the barrier layer 123, the free layer 124, the antiferromagnetic layer 230, and the heavy metal layer 110 in FIG. 4 are rounded rectangles in FIG. 5. The film surface shape AG2 corresponding to the cap layer 121 and the pinned layer 122 in FIG. 4 are ellipses in FIG. 5. The length and the width of the rounded rectangle are respectively presented as L and W. A line segment L1 presents a middle line of the film surface shape AG1 along a length direction, and a line segment L2 presents a middle line of the film surface shape AG1 along a width direction. It could be seen from FIG. 5 that the film surface shape AG2 is located at a center of the film surface shape AG1, and center points of the first via 340, the film surface shape AG2, and the second via 341 all pass through the line segment L1.

When the input current EL flows through the heavy metal layer with the film surface shape AG1 from left to right, a magnetic moment $T_{SOT}$ is generated. At this time, a magnetic moment vector of the free layer 124 in FIG. 4 is presented as $M_{free}$; an exchange field vector of the antiferromagnetic layer 230 in FIG. 4 is presented as $H_{EB,AFM}$; and a magnetic moment vector of the pinned layer 122 in FIG. 4 is presented as $M_{pin}$. The magnetic moment vectors of the free layer 124 and the pinned layer 122 in FIG. 4 are determined according to a long axis direction in the film surface shape (the ellipse) of the pinned layer 122, and the magnetic moment vector of the free layer 124 in FIG. 4 is arranged parallel to the film surface.

Figure 6:
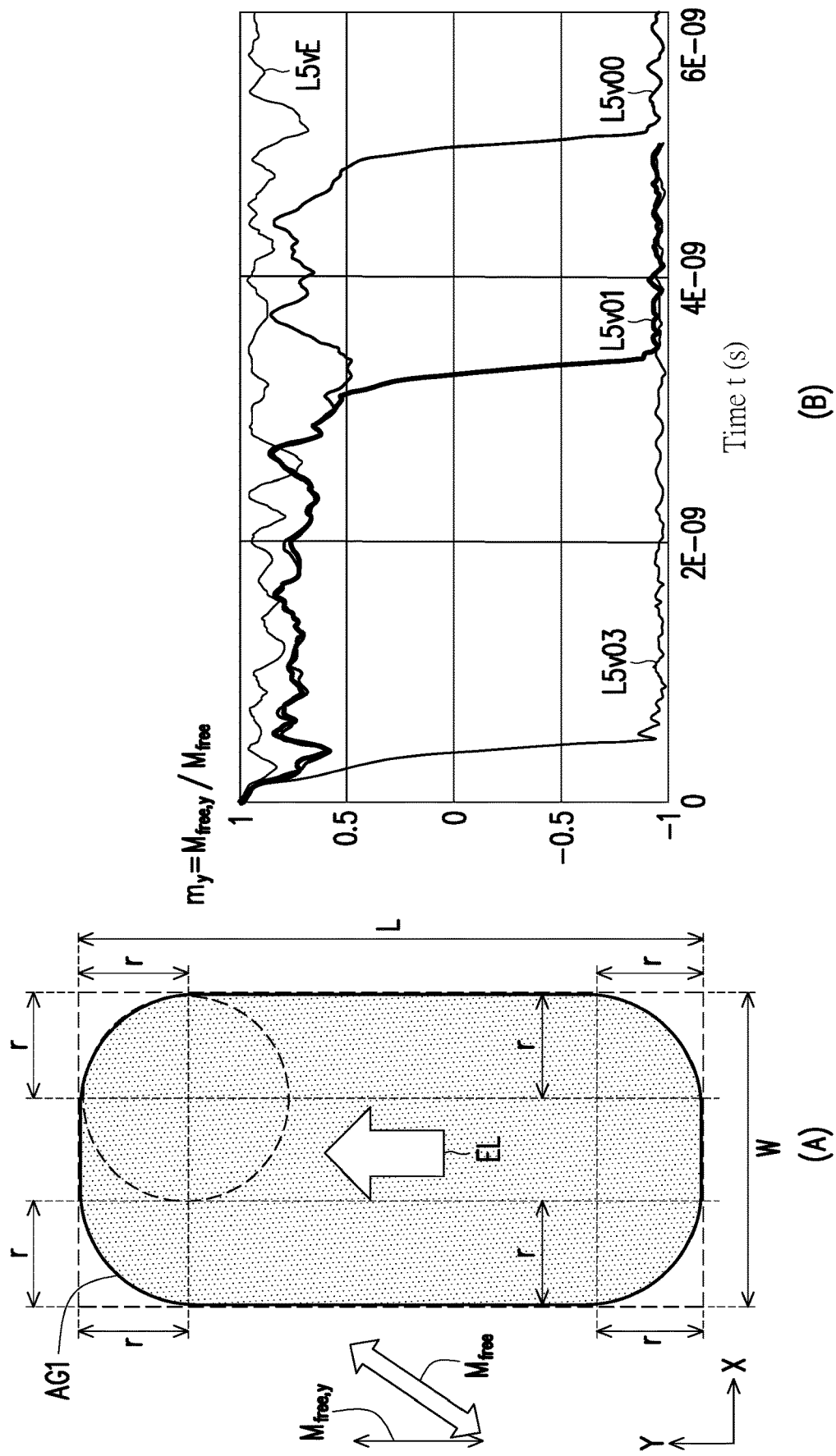
FIG. 6 is a relationship schematic view of influence of adopting a rounded rectangle on a magnetic moment according to Embodiment 2 of the disclosure.

FIG. 6 is a relationship schematic view of influence of adopting a rounded rectangle on a magnetic moment according to Embodiment 2 of the disclosure. Part (A) in FIG. 6 presents the film surface shape AG1 (that is, the rounded rectangle) of the free layer 124 in FIG. 4 presented in FIG. 5 and the flow direction of the input current EL. In addition to presenting the length L (exemplified as 400 nm in the embodiment) and the width W (exemplified as 200 nm in the embodiment), the film surface shape AG1 (the rounded rectangle) also presents a radius r of the rounded corner. Also, the parameter v is set, and the parameter v is a quotient obtained by dividing the width W of the rounded rectangle by the radius r of the rounded corner. Part (B) in FIG. 6 presents that under different parameters v, a magnetic moment component $m_y$ in a Y direction in the free layer needs a corresponding time to be reversed. The magnetic moment component $m_y$ is obtained by dividing a component $M_{free,y}$ of a magnetic moment vector $M_{free}$ in the Y direction by the magnetic moment vector $M_{free}$ (that is, $m_y = M_{free,y}/M_{free}$).

A curve L5v00 of Part (B) in FIG. 6 is the case where the parameter v is zero (v=0), that is, the film surface shape of the free layer is a right-angled rectangle. A curve L5v01 is the case where the parameter v is 0.1 (v=0.1). A curve L5v03 is the case where the parameter v is 0.3 (v=0.3). A curve L5vE is the case where the film surface shape of the free layer is directly elliptical. It could be seen from FIG. 6 that for the time required for reversing the magnetic moment vector (labeled as $M_{free}$ in FIG. 5) of the free layer, the curve L5v00 takes a longer time, followed by the curve L5v01, and the curve L5v03 takes the shortest time required for reversing the magnetic moment. The curve L5vE may take the longest time required for reversing the magnetic moment of the free layer. Therefore, it could be seen from the experimental results presented in FIG. 6 that the radius r of the film surface shape AG1 (that is, the rounded rectangle) affects the reversal properties of the magnetic moment of the free layer. In the embodiment, when the parameter v is 0.1 or 0.3 (that is, r=0.1 W or r=0.3 W), the reversal properties of the magnetic moment are better compared to the film surface shape of the free layer being a right-angled rectangle.

FIG. 7 is a top view of a structure of an in-plane magnetized spin-orbit magnetic device 400-2 according to Embodiment 2-2 of the disclosure. The difference between FIG. 7 and FIG. 4 is that the center points of the first via 340 and the second via 341 in FIG. 7 are designed to be moved and to be apart from the line segment L1 by a distance s, so that there is a preset included angle Φ between the connecting line between the first via 340 and the second via 341 on the film surface plane (that is, the XY plane) and the short axis direction of the ellipse in the film surface shape AG2 of the pinned layer, and the included angle Φ is not zero degrees. Since the positions of the first via 340 and the second via 341 are adjusted, the flow direction of the input current EL and the direction of the magnetic moment $T_{SOT}$ are adjusted accordingly. It could be seen from experiments that when there is the included angle Φ (the included angle Φ is approximately between ±50 degrees), the switching current density required for reversing the in-plane magnetized spin-orbit magnetic device 400-2 could be reduced.

FIG. 8 is a top view of a structure of an in-plane magnetized spin-orbit magnetic device 400-3 according to Embodiment 2-3 of the disclosure. The difference between FIG. 8 and FIG. 4 is that the long axis direction of the ellipse in the film surface shape AG2 of the pinned layer is designed to be rotated, so that there is a preset included angle θ between the connecting line between the first via 340 and the second via 341 on the film surface plane (that is, the XY plane) and the short axis direction of the ellipse in the film surface shape AG2 of the pinned layer, and the included angle θ is not zero degrees. Since the long axis direction of the film surface shape AG2 (the ellipse) is adjusted, the directions of the magnetic moment vector $M_{pin}$ of the pinned layer 122 and the exchange field vector $H_{EB,AFM}$ of the antiferromagnetic layer 230 are adjusted accordingly. It could be seen from experiments that when there is the included angle θ (the included angle θ is approximately between ±50 degrees), the switching current density required for reversing the in-plane magnetized spin-orbit magnetic device 400-3 could be reduced.

In Embodiment 2-1 of FIG. 5, the in-plane magnetized spin-orbit magnetic device 400-1 has the antiferromagnetic layer between the heavy metal layer and the magnetic tunnel junction, thereby increasing the thermal stability of the free layer in the magnetic device when being reversed; and the film surface shape of the free layer is designed as the rounded rectangle to affect the reversal properties of the magnetic moment through the radius parameter of the rounded corner. In addition, in Embodiment 2-2 of FIG. 7 and Embodiment 2-3 of FIG. 8, the in-plane magnetized spin-orbit magnetic devices 400-2 and 400-3 not only have the structure of Embodiment 2-1 of FIG. 5, the position of the via or the placement angle of the pinned layer is also adjusted, so that there is the preset included angle between the switching current and the short axis direction of the ellipse of the pinned layer to reduce the switching current density required for reversing the aforementioned device.

In some embodiments, the switching current density required for reversing the aforementioned device could be reduced by only adjusting the position of the via or the placement angle of the pinned layer without adjusting the film surface shape of the free layer. For example, persons applying the embodiment may design the film surface shape of the free layer in Embodiment 2-2 of FIG. 7 and Embodiment 2-3 of FIG. 8 from the rounded rectangle in the embodiment to the original right-angled rectangle according to requirements, and add the antiferromagnetic layer and adjust the position of the via or the placement angle of the pinned layer to obtain the preset included angle, thereby reducing the switching current density required for reversing the aforementioned device.

Figure 9:
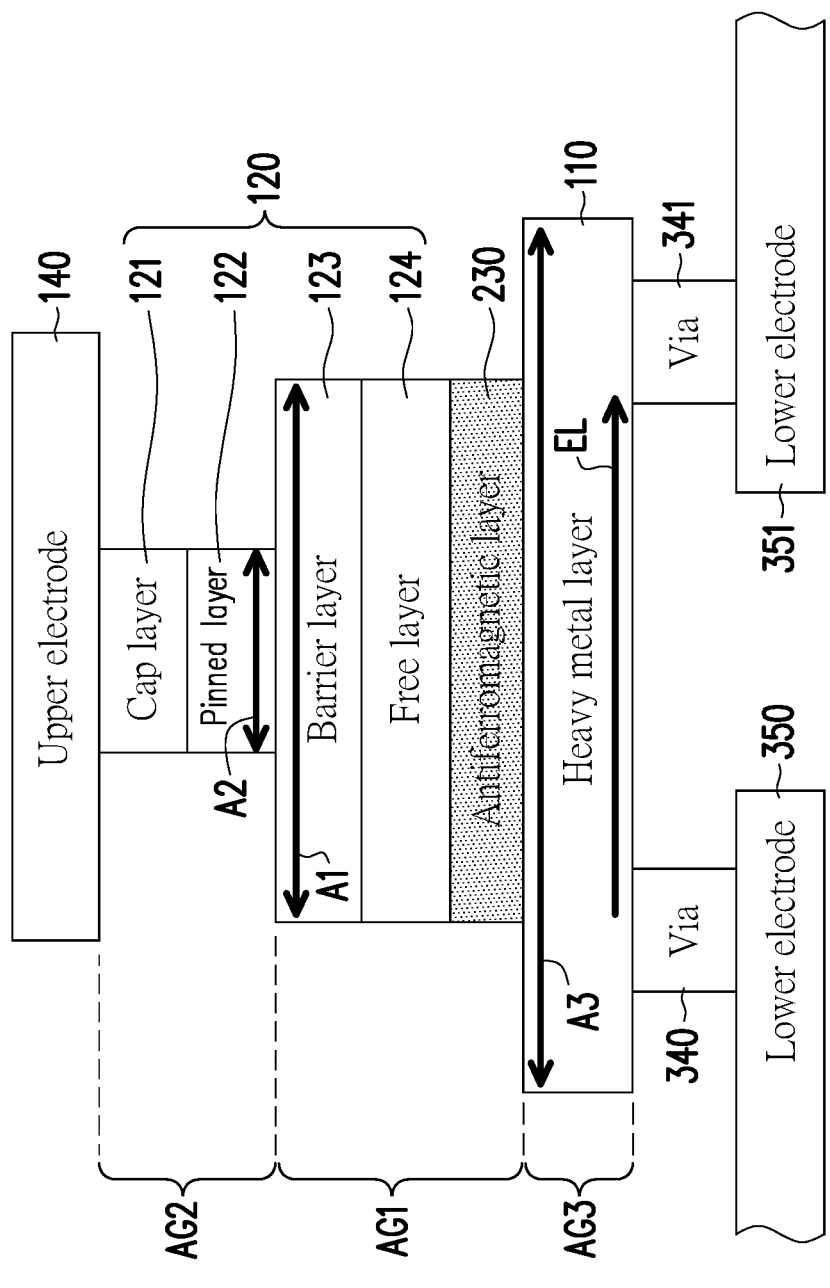
FIG. 9 is a schematic view of a structure of an in-plane magnetized spin-orbit magnetic device according to Embodiment 3 of the disclosure.

FIG. 9 is a schematic view of an in-plane magnetized spin-orbit magnetic device 900 according to Embodiment 3 of the disclosure. The difference from FIG. 4 is that in Embodiment 3 of FIG. 9, the barrier layer 123 of the magnetic tunnel junction 120 has the same film surface area A1 as the free layer 124 and the antiferromagnetic layer 230, and the barrier layer 123, the free layer 124, and the antiferromagnetic layer 230 have the same film surface shape AG1 (presented as rounded rectangles in FIG. 10, FIG. 11, and FIG. 13). The cap layer 121 and the pinned layer 122 of the magnetic tunnel junction 120 have the same film surface area A2, and the cap layer 121 and the pinned layer 122 have the same film surface shape AG2 (presented as ellipses in FIG. 10, FIG. 11, and FIG. 13). The film surface area A2 of the ellipse is smaller than the film surface area A1 of the rounded rectangle. The heavy metal layer 110 has a film surface area A3, and the heavy metal layer 110 has a film surface shape AG3 (presented as right-angled rectangles in FIG. 10, FIG. 11, and FIG. 13). Therefore, since the antiferromagnetic layer 230 is disposed under the free layer 124 in the magnetic tunnel junction 120, the thermal stability of the free layer 124 when being reversed is significantly improved.

Figure 10:
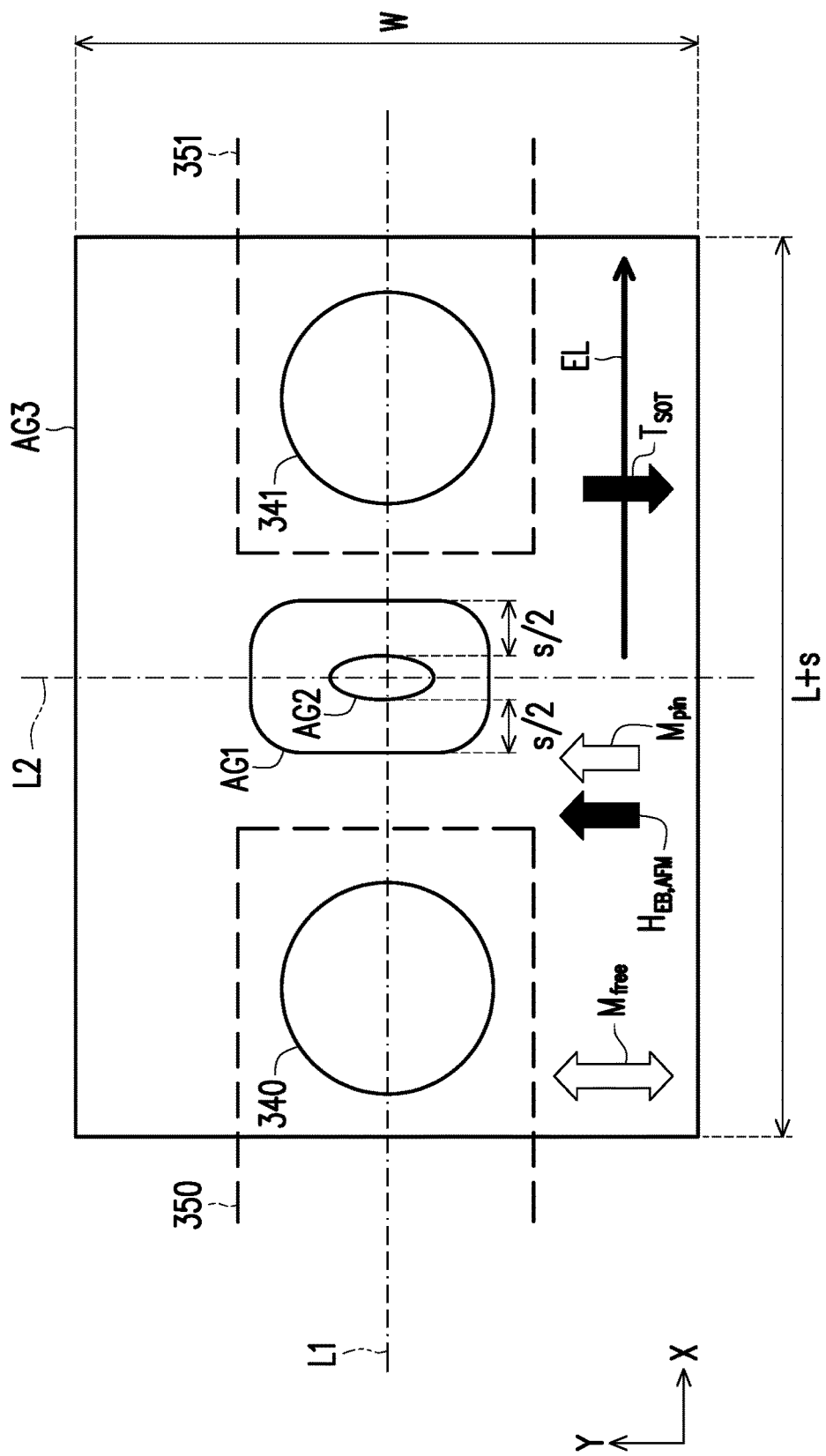
FIG. 10 is a top view of a structure of an in-plane magnetized spin-orbit magnetic device according to Embodiment 3-1 of the disclosure.
Figure 11:
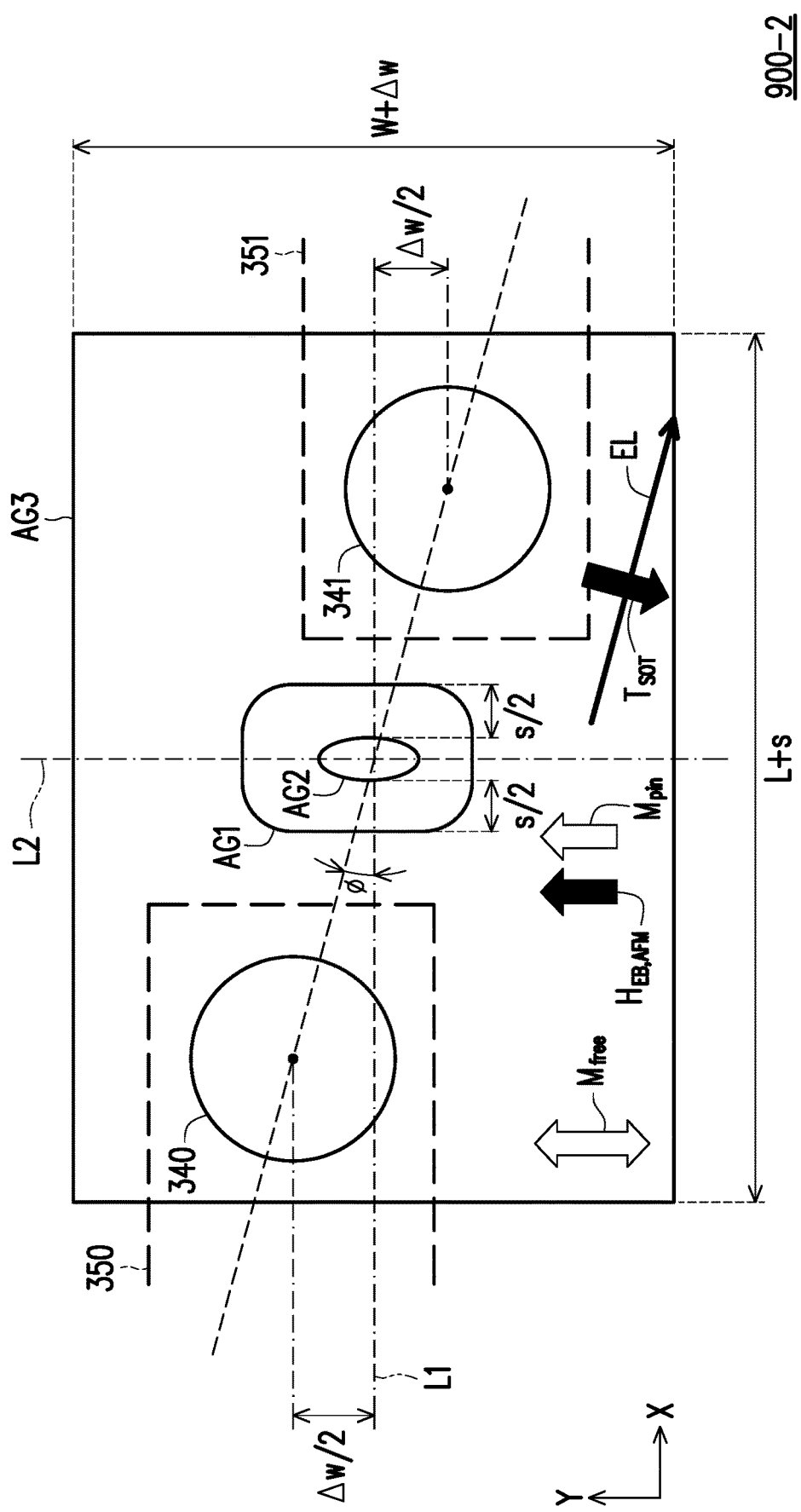
FIG. 11 is a top view of a structure of an in-plane magnetized spin-orbit magnetic device according to Embodiment 3-2 of the disclosure.
Figure 13:
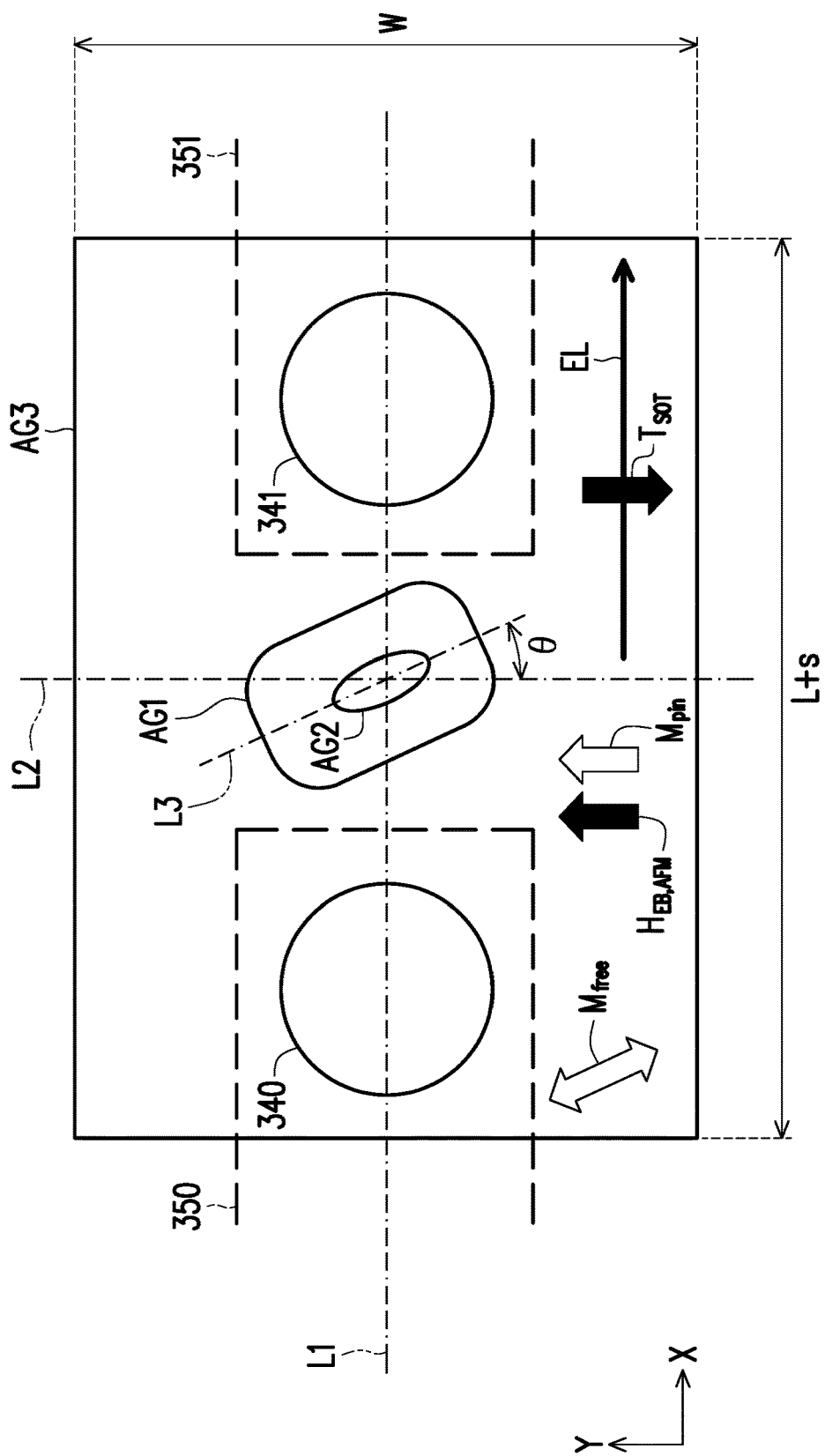
FIG. 13 is a top view of the structure of the in-plane magnetized spin-orbit magnetic device according to Embodiment 3-3 of the disclosure.

Since the adjustment of the placement relationship between the two vias 340 and 341 and the pinned layer 122 and the free layer 124 on the XY plane also presents different technical solutions, which could not be presented through the cross-sectional view of the structure of FIG. 9, the same will be presented through the top views of the structures of FIG. 10, FIG. 11, and FIG. 13.

FIG. 10 is a top view of a structure of an in-plane magnetized spin-orbit magnetic device 900-1 according to Embodiment 3-1 of the disclosure. Please refer to FIG. 9 and FIG. 10 at the same time. The film surface shape AG1 corresponding to the barrier layer 123, the free layer 124, and the antiferromagnetic layer 230 in FIG. 9 are rounded rectangles in FIG. 10. The film surface shape AG2 corresponding to the cap layer 121 and the pinned layer 122 in FIG. 9 are ellipses in FIG. 10. The film surface shape AG3 corresponding to the heavy metal layer 110 in FIG. 9 is a tight-angled rectangle in FIG. 10. There is the distance s between the length of a short axis of the film surface shape AG2 (the ellipse) and the width of the film surface shape AG1 (the rounded rectangle), so the short axis of the film surface shape AG2 (the ellipse) to two sides of the boundary of the film surface shape AG1 (the rounded rectangle) in FIG. 10 are marked with two distances "s/2". The length and the width of the right-angled rectangle are respectively presented as "L+s" and W. The line segment L1 presents the middle line of the film surface shape AG1 along the length direction, and the line segment L2 presents the middle line of the film surface shape AG1 along the width direction. It could be seen from FIG. 10 that the film surface shape AG2 is located at a center of the film surface shapes AG1 and AG3, and center points of the first via 340, the film surface shapes AG1, AG2, and AG3, and the second via 341 all pass through the line segment L1.

When the input current EL flows through the heavy metal layer with the film surface shape AG1 from left to right, the magnetic moment $T_{SOT}$ is generated. At this time, the magnetic moment vector of the free layer 124 in FIG. 9 is presented as $M_{free}$; the exchange field vector of the antiferromagnetic layer 230 in FIG. 9 is presented as $H_{EB,AFM}$; and the magnetic moment vector of the pinned layer 122 in FIG. 9 is presented as $M_{pin}$. The magnetic moment vector of the free layer 124 in FIG. 9 is determined according to a long side direction in the film surface shape (the rounded rectangle) of the free layer 124, the magnetic moment vector of the pinned layer 122 in FIG. 9 is determined according to the long axis direction in the film surface shape (the ellipse) of the pinned layer 122, and the magnetic moment vector of the free layer 124 in FIG. 9 is arranged parallel to the film surface.

FIG. 11 is a top view of a structure of an in-plane magnetized spin-orbit magnetic device 900-2 according to Embodiment 3-2 of the disclosure. The difference between FIG. 11 and FIG. 10 is that the center points of the first via 340 and the second via 341 in FIG. 10 are designed to be moved and to be apart from the line segment L1 by a distance "Δw/2", so that there is the preset included angle Φ between the connecting line between the first via 340 and the second via 341 on the film surface plane (that is, the XY plane) and the short axis direction of the ellipse in the film surface shape AG2 of the pinned layer, and the included angle Φ is not zero degrees. In FIG. 11, the length and the width of the right-angled rectangle (the film surface shape AG3) are respectively presented as "L+s" and "W+Δw". Since the positions of the first via 340 and the second via 341 are adjusted, the flow direction of the input current EL and the direction of the magnetic moment $T_{SOT}$ are adjusted accordingly. It could be seen from experiments that when there is the included angle Φ (the included angle Φ is approximately between ±50 degrees), the switching current density required for reversing the in-plane magnetized spin-orbit magnetic device 900-2 could be reduced.

Figure 12:
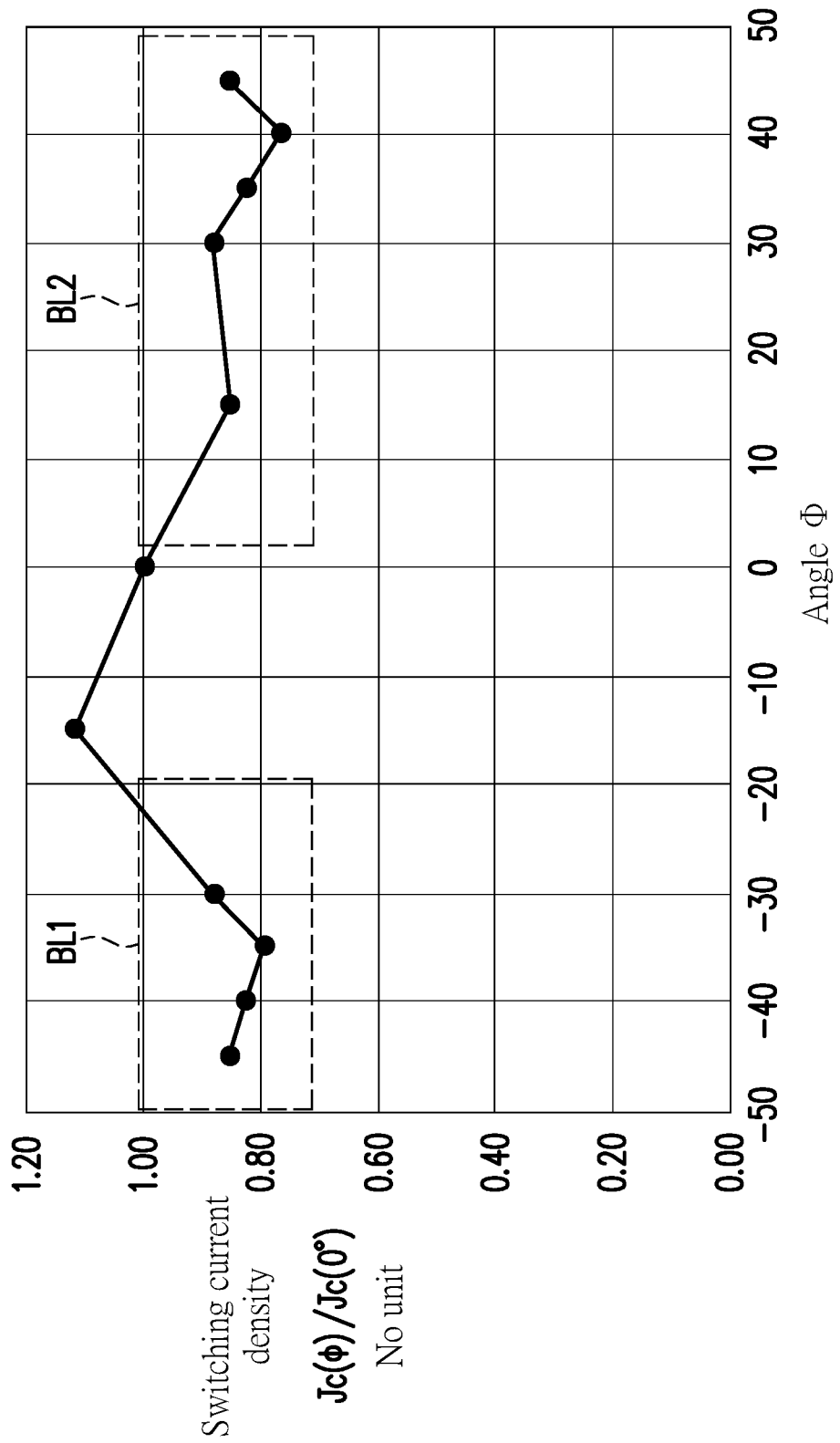
FIG. 12 is a relationship schematic view of an included angle between a connecting line between vias on a film surface plane and a short axis direction of an ellipse corresponding to a switching current density according to Embodiment 3-2 of the disclosure.

FIG. 12 is a relationship schematic view of an included angle between a connecting line between vias on a film surface plane and a short axis direction of an ellipse corresponding to a switching current density according to Embodiment 3-2 of the disclosure. In the embodiment, a quotient obtained by dividing a switching current $J_C(\Phi)$ at a specific included angle Φ by a switching current $J_C(0°)$ at an angle of zero degrees is referred to as the switching current density. As shown in FIG. 12, when the preset included angle Φ is in an interval BL1 from −45 degrees to −21 degrees and an interval BL2 from 1 degree to 45 degrees, the switching current density is smaller than the switching current density when the preset included angle Φ is zero degrees. In other words, when the preset included angle Φ is in the intervals BL1 and BL2, the switching current density that could reverse the aforementioned device is reduced.

FIG. 13 is a top view of a structure of an in-plane magnetized spin-orbit magnetic device 900-3 according to Embodiment 3-3 of the disclosure. The difference between FIG. 13 and FIG. 11 is that the long axis direction of the rounded rectangle in the film surface shape AG1 of the pinned layer is designed to rotate, so that there is the included angle θ between the long side direction (as shown by the line segment L3) of the film surface shape AG1 of the free layer and the long axis direction (as shown by the line segment L2) of the ellipse in the film surface shape AG2 of the pinned layer, and the included angle θ is not zero degrees. Since the long axis direction of the film surface shape AG1 (the rounded rectangle) is adjusted, the direction of the magnetic moment vector $M_{free}$ of the free layer is adjusted accordingly. It could be seen from experiments that when there is the included angle θ (the included angle θ is approximately between ±50 degrees), the switching current density required for reversing the in-plane magnetized spin-orbit magnetic device 900-3 could be reduced.

Figure 14:
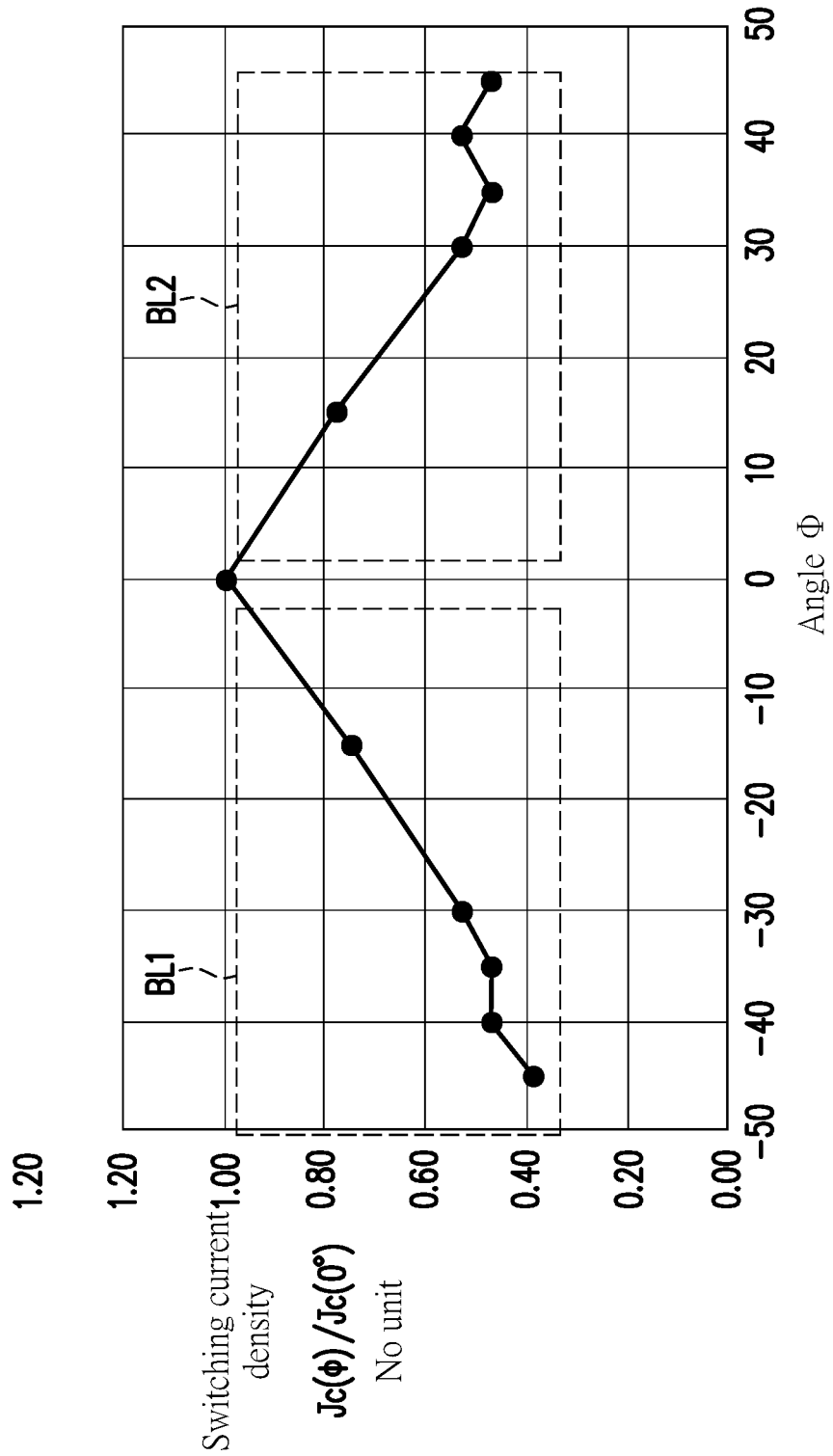
FIG. 14 is a relationship schematic view of an included angle between a long side direction of a free layer and a long axis direction of an ellipse corresponding to a switching current density according to Embodiment 3-3 of the disclosure.

FIG. 14 is a relationship schematic view of an included angle θ between a long side direction of a free layer and a long axis direction of an ellipse corresponding to a switching current density according to Embodiment 3-3 of the disclosure. The switching current density described in FIG. 14 and FIG. 12 has the same meaning. As shown in FIG. 14, when the preset included angle θ is in the interval BL1 from −45 degrees to −1 degree and the interval BL2 from 1 degree to 45 degrees, the switching current density is smaller than the switching current density when the preset included angle θ is zero degrees. In other words, when the preset included angle θ is in the intervals BL1 and BL2, the switching current density that could reverse the aforementioned device is reduced.

In Embodiment 3-1 of FIG. 10, the in-plane magnetized spin-orbit magnetic device 900-1 has the antiferromagnetic layer between the heavy metal layer and the magnetic tunnel junction, thereby increasing the thermal stability of the free layer in the magnetic device when being reversed; and the film surface shape AG1 of the free layer is designed as a rounded rectangle to affect the reversal properties of the magnetic moment through the radius parameter of the rounded corner. In addition, in Embodiment 3-2 of FIG. 11 and Embodiment 3-3 of FIG. 13, the in-plane magnetized spin-orbit magnetic devices 900-2 and 900-3 not only have the structure of Embodiment 3-1 of FIG. 10, the position of the via or the placement angle of the free layer is also adjusted, so that there is the preset included angle (first included angle) between the switching current and the short axis direction of the ellipse of the film surface shape of the pinned layer. Alternatively, a second included angle between the long side direction of the free layer and the long axis direction of the ellipse in the film surface shape of the pinned layer is adjusted, so that the second included angle is not a right angle to reduce the switching current density required for reversing the aforementioned device.

In some embodiments, the switching current density required for reversing the aforementioned device could be reduced by only adjusting the position of the via or the placement angle of the pinned layer without adjusting the film surface shape of the free layer. For example, persons applying the embodiment may design the film surface shape of the free layer in Embodiment 3-2 of FIG. 11 and Embodiment 3-3 of FIG. 13 from the rounded rectangle in the embodiment to the original right-angled rectangle according to requirements, and add the antiferromagnetic layer and adjust the position of the via or the placement angle of the pinned layer or the free layer to obtain the preset included angle, thereby reducing the switching current density required for reversing the aforementioned device.

In summary, the in-plane magnetized spin-orbit magnetic device provided in the embodiments of the disclosure is designed such that the antiferromagnetic layer is added between the heavy metal layer and the magnetic tunnel junction, thereby increasing the thermal stability of the free layer in the magnetic device when being reversed. The film surface shape of the free layer in the embodiments of the disclosure is designed as a rounded rectangle to affect the reversal properties of the magnetic moment through the radius parameter of the rounded corner, so that the magnetic moment of the free layer is more easily affected by the spin-orbit-torque to be adjusted. The placement angle of the vias and the pinned layer in the embodiments of the disclosure is adjusted, so that there is the preset included angle between the switching current and the short axis direction of the ellipse of the film surface shape of the pinned layer to reduce the switching current density required for reversing the aforementioned device. The aforementioned manners may all be applied to the in-plane magnetized spin-orbit magnetic device, so that while the free layer has thermal stability, the magnetic moment of the free layer may be more easily affected by the spin-orbit-torque caused by the current of the heavy metal layer to be magnetically reversed, so the magnitude of the write current in the heavy metal layer could be reduced, thereby achieving a power saving effect.

What is claimed is:

1. An in-plane magnetized spin-orbit magnetic device, comprising:
    a heavy metal layer;
    an antiferromagnetic layer, disposed on the heavy metal layer; and
    a magnetic tunnel junction, disposed on the antiferromagnetic layer, wherein the magnetic tunnel junction comprises:
    a free layer;
    a barrier layer, disposed on the free layer; and
    a pinned layer, disposed on the barrier layer, wherein
    a film surface shape of the free layer is a rounded rectangle,
    wherein a material of the free layer is a ferromagnetic material with horizontal heterogeneity, and a magnetic moment vector of the free layer is arranged parallel to a film surface.

2. The in-plane magnetized spin-orbit magnetic device according to claim 1, wherein a film surface shape of the pinned layer is an ellipse, and a film surface area of the ellipse is smaller than a film surface area of the rounded rectangle.

3. The in-plane magnetized spin-orbit magnetic device according to claim 2, wherein a film surface shape of the barrier layer, the free layer, and the antiferromagnetic layer is the rounded rectangle.

4. The in-plane magnetized spin-orbit magnetic device according to claim 3, further comprising:
    a cap layer, disposed on the pinned layer, wherein
    a film surface shape of the cap layer and the pinned layer is the ellipse.

5. The in-plane magnetized spin-orbit magnetic device according to claim 3, further comprising:
    an upper electrode, disposed on the cap layer.

6. The in-plane magnetized spin-orbit magnetic device according to claim 1, wherein a film surface shape of the antiferromagnetic layer is same as the film surface shape of the free layer.

7. The in-plane magnetized spin-orbit magnetic device according to claim 3, wherein a film surface shape of the heavy metal layer is a right-angled rectangle or a rounded rectangle, wherein a film surface area of the right-angled rectangle or the rounded rectangle is larger than a film surface area of the ellipse.

8. The in-plane magnetized spin-orbit magnetic device according to claim 2, further comprising:
    a first via and a second via, disposed under the heavy metal layer;
    a first lower electrode, coupled to the heavy metal layer by the first via; and
    a second lower electrode, coupled to the heavy metal layer by the second via, wherein
    there is an included angle between a connecting line between the first via and the second via on a film surface plane and a short axis direction of the ellipse in the film surface shape of the pinned layer or there is the included angle between a long side direction of the free layer and a long axis direction of the ellipse in the film surface shape of the pinned layer, wherein the included angle is not zero degrees.

9. The in-plane magnetized spin-orbit magnetic device according to claim 1, wherein a material of the pinned layer is a ferromagnetic material with an in-plane magnetic moment, and a magnetic moment vector of the pinned layer is arranged parallel to a film surface.

10. The in-plane magnetized spin-orbit magnetic device according to claim 1, wherein an annealing direction of the pinned layer during a semiconductor manufacturing process for manufacturing the in-plane magnetized spin-orbit magnetic device is same as a long axis direction of a film surface shape of the pinned layer.

11. The in-plane magnetized spin-orbit magnetic device according to claim 1, wherein the heavy metal layer obtains an input current through an electrode contact to generate a spin current, so that the magnetic tunnel junction is magnetically reversed.

12. An in-plane magnetized spin-orbit magnetic device, comprising:
    a heavy metal layer; and
    an antiferromagnetic layer, disposed on the heavy metal layer;
    a magnetic tunnel junction, disposed on the antiferromagnetic layer;
    a first via and a second via, disposed under the heavy metal layer;
    a first lower electrode, coupled to the heavy metal layer by the first via; and
    a second lower electrode, coupled to the heavy metal layer by the second via, wherein
    the magnetic tunnel junction comprises:
    a free layer;
    a barrier layer, disposed on the free layer; and
    a pinned layer, disposed on the barrier layer, wherein a film surface shape of the pinned layer is an ellipse, wherein
    there is a first included angle between a connecting line between the first via and the second via on a film surface plane and a short axis direction of the ellipse in the film surface shape of the pinned layer, wherein the first included angle is not zero degrees, or there is a second included angle between a long side direction of the free layer and a long axis direction of the ellipse in the film surface shape of the pinned layer, wherein the second included angle is not a right angle.

13. The in-plane magnetized spin-orbit magnetic device according to claim 12, wherein a film surface shape of the free layer is a rounded rectangle, and a film surface area of the ellipse is smaller than a film surface area of the rounded rectangle.

14. The in-plane magnetized spin-orbit magnetic device according to claim 13, wherein a film surface shape of the barrier layer, the free layer, and the antiferromagnetic layer is the rounded rectangle.

15. The in-plane magnetized spin-orbit magnetic device according to claim 12, further comprising:
a cap layer, disposed on the pinned layer, wherein
a film surface shape of the cap layer and the pinned layer is the ellipse.

16. The in-plane magnetized spin-orbit magnetic device according to claim 12, wherein a film surface shape of the antiferromagnetic layer is same as a film surface shape of the free layer.

17. The in-plane magnetized spin-orbit magnetic device according to claim 12, wherein a film surface shape of the heavy metal layer is a right-angled rectangle or a rounded rectangle, wherein a film surface area of the right-angled rectangle or the rounded rectangle is larger than a film surface area of the ellipse.

18. The in-plane magnetized spin-orbit magnetic device according to claim 12, wherein a material of the pinned layer is a ferromagnetic material with an in-plane magnetic moment, and a magnetic moment vector of the pinned layer is arranged parallel to a film surface.

19. The in-plane magnetized spin-orbit magnetic device according to claim 12, wherein an annealing direction of the pinned layer during a semiconductor manufacturing process for manufacturing the in-plane magnetized spin-orbit magnetic device is same as a long axis direction of the film surface shape of the pinned layer.

20. An in-plane magnetized spin-orbit magnetic device, comprising:
a heavy metal layer;
an antiferromagnetic layer, disposed on the heavy metal layer; and
a magnetic tunnel junction, disposed on the antiferromagnetic layer, wherein the magnetic tunnel junction comprises:
a free layer;
a barrier layer, disposed on the free layer; and
a pinned layer, disposed on the barrier layer, wherein
a film surface shape of the free layer is a rounded rectangle,
wherein a film surface shape of the antiferromagnetic layer is same as the film surface shape of the free layer.

* * * * *